United States Patent [19]

Farnworth et al.

[11] Patent Number: 5,256,598
[45] Date of Patent: Oct. 26, 1993

[54] SHRINK ACCOMMODATING LEAD FRAME

[75] Inventors: Warren M. Farnworth, Nampa; Alan G. Wood, Boise, both of Id.

[73] Assignee: Micron Technology, Inc., Boise, Id.

[21] Appl. No.: 869,654

[22] Filed: Apr. 15, 1992

[51] Int. Cl.⁵ .................................. H01L 21/60
[52] U.S. Cl. .................... 437/220; 437/206; 437/207; 437/214; 437/217
[58] Field of Search ............ 437/206, 209, 217, 220, 437/207, 214

[56] References Cited

U.S. PATENT DOCUMENTS

| | | | |
|---|---|---|---|
| 3,777,365 | 12/1973 | Umbaugh | 437/206 |
| 4,065,851 | 1/1978 | Kummer et al. | 437/206 |
| 4,534,105 | 8/1985 | Reusch | 437/220 |
| 4,807,018 | 2/1989 | Cellai | 437/209 |
| 4,837,184 | 6/1989 | Lin et al. | 437/217 |
| 4,868,635 | 9/1989 | Frechette et al. | 357/70 |
| 4,971,930 | 11/1990 | Fusaroli et al. | 437/217 |
| 4,994,411 | 2/1991 | Naito et al. | 437/217 |
| 5,064,706 | 11/1991 | Ueda et al. | 437/220 |
| 5,086,018 | 2/1992 | Conru et al. | 437/220 |

Primary Examiner—Brian E. Hearn
Assistant Examiner—Kevin M. Pilardat
Attorney, Agent, or Firm—Stanley N. Protigal

[57] ABSTRACT

A lead frame design which can be used with a number of different die sizes is described. To customize the lead frame, a punch excises an amount of lead finger material to form a void between the lead fingers for receiving a die. The amount of material removed is greater for larger sized die. A material, such as an adhesive tape, attaches the die to the lead frame. The bond pads on the die are then wire bonded to the lead fingers. The adhesive tape also locks the lead fingers into place, thereby preventing movement which could detach the bond wires from the die or lead frame.

11 Claims, 4 Drawing Sheets

SHRINK ACCOMMODATING LEAD FRAME

FIELD OF THE INVENTION

This invention relates to the field of semiconductor manufacture. More specifically, a lead frame design which can accommodate a wide variety of die sizes while allowing for short bond wires is disclosed. The invention also results in immobilized lead fingers, thereby reducing bond wire detach problems.

BACKGROUND OF THE INVENTION

Various types of semiconductor devices are manufactured in much the same way. A starting substrate, usually a thin wafer of silicon or gallium arsenide, is masked, etched, and doped through several process steps, the steps depending on the type of devices being manufactured. This process yields a number of die on each wafer produced. The die are separated with a die saw, and then packaged into individual components.

During the packaging process, several semiconductor die are attached to a lead frame, often with a material such as metal, or an epoxy or other viscous adhesives. Bond wires couple each of several bond pads on each die to conductive leads on the lead frame. The die, the wires, and a portion of the leads are encapsulated in plastic or encased in ceramic. These leads couple the die with the device into which the component is installed, thereby forming a means of I/O between the die and the device.

One step of semiconductor manufacture that is not without problems is the die-lead frame attachment. During the manufacturing process, several die are attached to the lead frame, bond wires are connected from the bond pads on each of the die to the "fingers" on the lead frame, then the die is encapsulated in a protective plastic casing. The plastic packages are separated, and the leads are formed into a desired shape. The lead frame, part of which will eventually form the conductive leads of the components, contains a major surface to which the die is attached, called the "paddle." The die is normally bonded to the paddle with epoxy or metal, although thermoplastic, tape, or another materials are also used. FIG. 1A is a top view, and FIG. 1B is a cross section, showing a conventional lead frame 10 having die paddles 12 with die 14 attached. The frame 10 comprises dam bars 16 which restrict the flow of encapsulating material during encapsulation, exterior leads 18 which are unencapsulated, and lead fingers 20 which will be encapsulated. Bond wires 22 electrically couple bond pads 24 on the die 14 with the lead fingers 20. The adhesive 26 used to attach the die 14 to the lead frame 10 is dispensed on the die paddle area 12 of the lead frame 10. The die 14 is placed on the uncured epoxy (for example) and held at a specific pressure by die attachment equipment having a surface contact tool or an edge contact only tool (collet). The die is pressed down into the adhesive at a specific pressure, and often at a controlled temperature, by the tool and held in place long enough to ensure adhesion. X-Y movement (scrub) is sometimes used to increase adhesion and to speed the process. The attach process often requires a follow-on cure in a separate cure oven. After the attach process, the assembly within the dam bars 16 is encapsulated. The paddle 12 of the lead frame 10 is usually at a lower plane 28, which allows better control of the plastic encapsulation material as it is being injected into the mold. This lessens the chance, for example, of the bond wires 22 detaching from the lead fingers or bond pads.

Various problems are associated with the connection of the die to the die paddle. Occasionally a corner of the die will crack, thereby making the semiconductor inoperable. This can result from stress placed upon the die by the adhesive due to an uneven thermal coefficient of expansion between the die and the adhesive. After the die is attached to the lead frame and oven cured, the assembly is heated at the wire bond step to attach the wire to the die pad. If the die and the adhesive expand at different rates, undue stresses can be inflicted on the die. Cracks can also occur from stress on the die due to shrinkage of the adhesive as it cures, although in recent years chemical improvements in adhesive has reduced this cause of cracking.

Occasionally the die and epoxy may come loose from the lead frame, a problem referred to as "popping die." Popping die can result from too little adhesive under the die, a poor bond between the adhesive and the paddle, or from bowing of the die paddle from heat or pressure. This can be a serious problem, not only because it results in scrapping the die but also because the loose die can damage the molds which are used to encapsulate the package.

Other problems are also associated with the lead frame. Once the die is attached to the die paddle, bond wires electrically couple bond pads on the die to lead fingers on the lead frame. Before encapsulation the lead fingers can move, thereby damaging the bond wire coupling the bond pads and lead fingers which results in an unreliable or nonfunctional device.

Another problem associated with packaging of a semiconductor device is that a new lead frame design must be used each time a die size changes. With conventional lead frames, the die paddle must be approximately the same size as the die, and therefore as the die decreases in size a lead frame with a smaller paddle must be used. Also, the lead fingers must be sufficiently close to the die to keep the bond wires which couple the lead fingers to the bond pad as short as possible. Long bond wires require more material (usually gold) than shorter wires and are therefore more expensive, and also have a greater likelihood of shorting or breaking. When a die is shrunk a new lead frame having a smaller die paddle and longer lead fingers must be produced. A die shrink therefore requires a retooling of the lead frame stamp, which currently costs more than $50,000. In addition, unused stock is discarded or recycled.

U.S. Pat. No. 4,868,635 to Frechette et al. describes a lead frame which can be customized to accommodate semiconductor dies of different sizes. This lead frame, however, would have the problem of lead movement, as can be determined from studying FIG. 3 of Frenchette et al.

A lead frame design which solved the problems associated with the die paddle and long leads, and those resulting from a die shrink would allow for reduced costs and increased yields.

SUMMARY OF THE INVENTION

An object of the invention is to provide a lead frame having no die paddle, thereby eliminating the problems associated with the die paddle. Another object of the invention is to provide a lead frame which can be used with a number of different die sizes. Yet another object of the invention is to provide a lead frame design which increases yields due to its immobilization of the lead fingers which prevents damage to the bond wired resulting from lead movement. Still another object of the invention is to provide a lead frame which lowers the production costs by increasing yields and by eliminating the need to retool the lead frame to accommodate a die redesigned for size reduction.

These objects of the invention are realized by a lead frame having an inventive design which can accommodate a number of different die sizes with minimal customization. The paddle-less lead frame comprises a number of leads which converge on the center of the die placement area. Prior to attaching the die and the lead frame, the leads are trimmed, the amount trimmed material depending on the die size. A smaller die requires less lead finger material to be trimmed. In any case, the leads are excised to provide a void to receive the die. To attach the die to the lead frame, a tape material having an adhesive on one side is attached to the leads, and the die is held in place by the tape. The tape also serves to immobilize the leads so that lead movement is greatly reduced or eliminated. This is especially important after attachment of the bond wires, as lead movement is known to damage the bond wires or their attachment to the die or lead frame, thereby producing a nonfunctional device.

Other possible configurations of the tape, lead frame, and die are possible.

It should be emphasized that the drawings of the instant application are not to scale but are merely schematic representations and are not intended to portray the specific parameters or the structural details of the invention, which can be determined by one of skill in the art by examination of the information herein.

DETAILED DESCRIPTION OF THE INVENTION

Figure 1A:
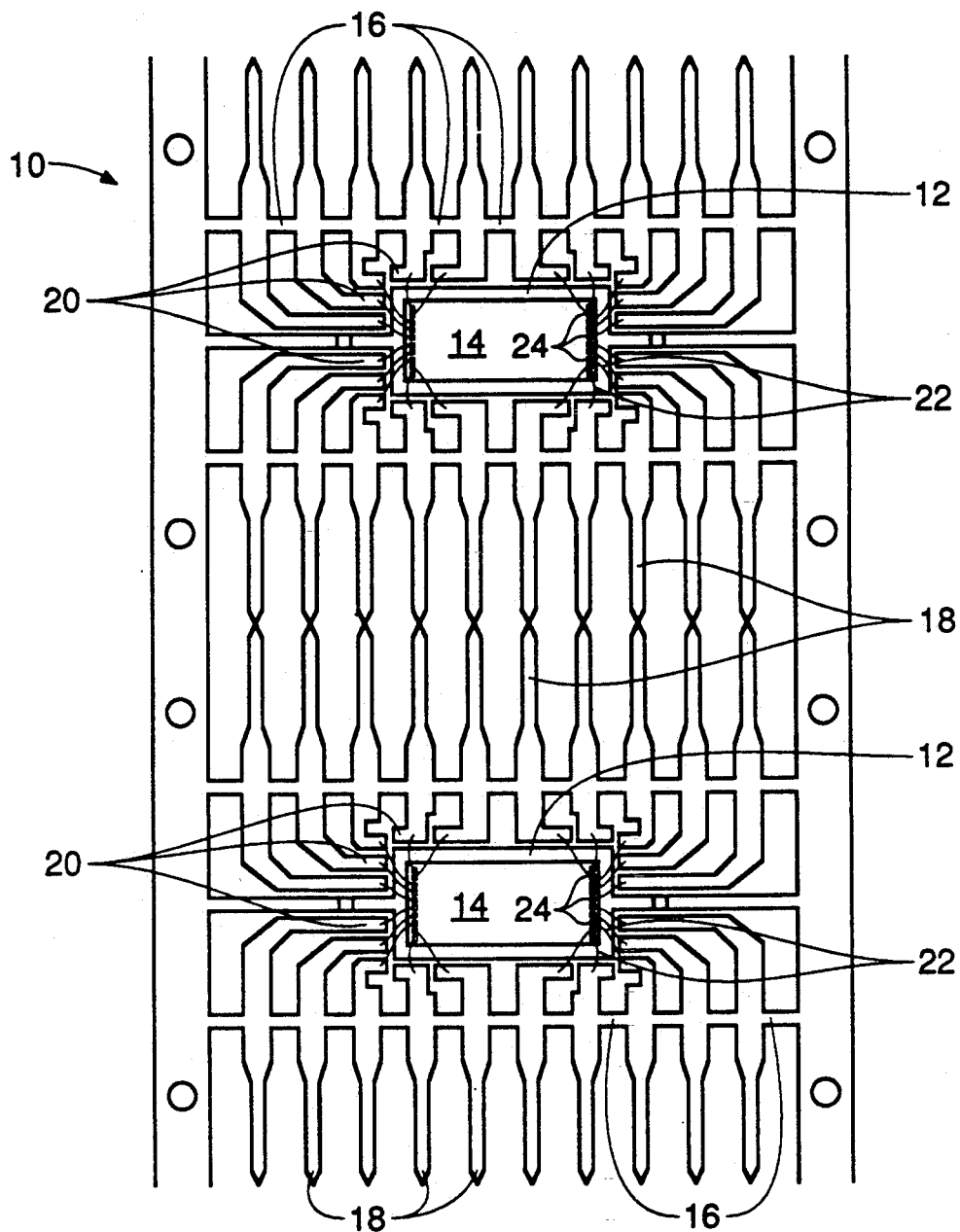
FIG. 1A is a top view.
Figure 1B:
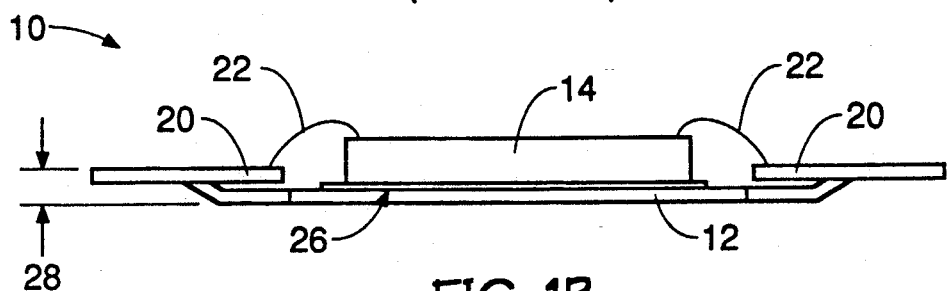
FIG. 1B is a cross section, showing a conventional lead frame having die paddles with die attached.
Figure 2:
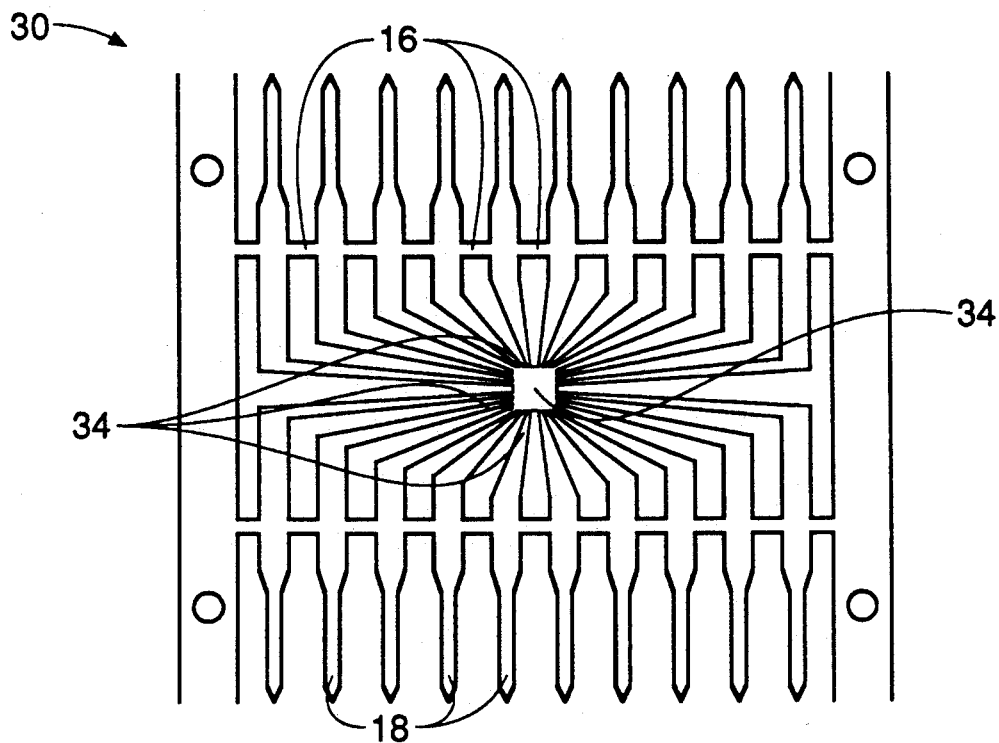
FIG. 2 is a top view of a lead frame comprising the invention having lead fingers which can be customized for a particular die size.
Figure 3A:
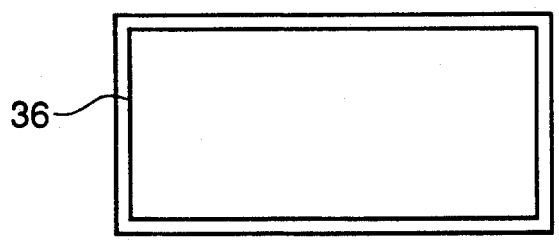
FIG. 3A shows an excise punch which could trim the lead fingers to a specific size, and 3B shows yet another excise punch which would accommodate a smaller die than the punch of FIG. 3A.
Figure 3B:
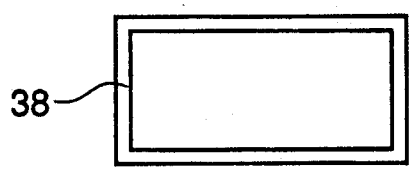

FIG. 2 shows a lead frame assembly comprising the invention. The lead frame 30 comprises lead fingers 32 which extend to the center of the die placement region 34. The lead fingers can be connected for support in this area as shown, or in other configurations, as this area will be removed before assembly of the die. It may also be possible to leave the leads unjoined. Depending on the size of the die which will be attached to the lead frame 30, a portion of the lead fingers is trimmed away, thereby leaving a void for receiving the die. The trimming of the lead fingers 32 establishes an inset of the lead fingers 32, which is a changes in the size of the void for receiving the die. The leads fingers should be trimmed as little as possible to allow for short bond wires. FIG. 3A shows an excise punch 36 which could trim the lead fingers 32. FIG. 3B shows a similar excise punch 38 which would trim the lead fingers 32 in preparation to receive a die having a smaller size than the punch of FIG. 3A.

Figure 4A:
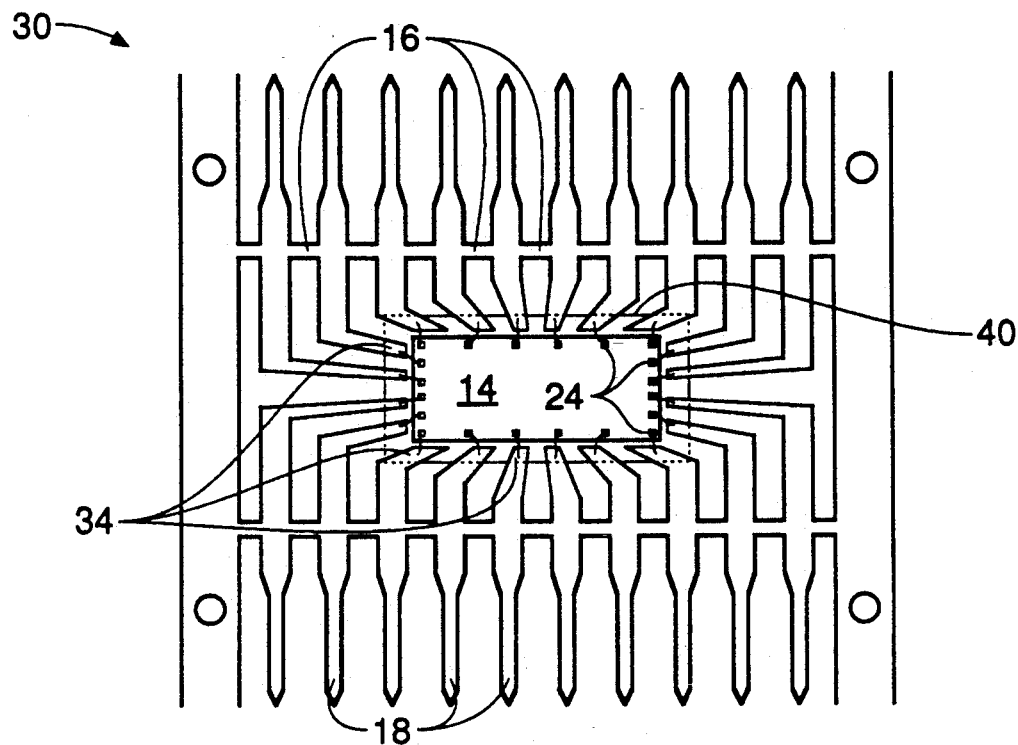
FIG. 4A is a top view.
Figure 4B:
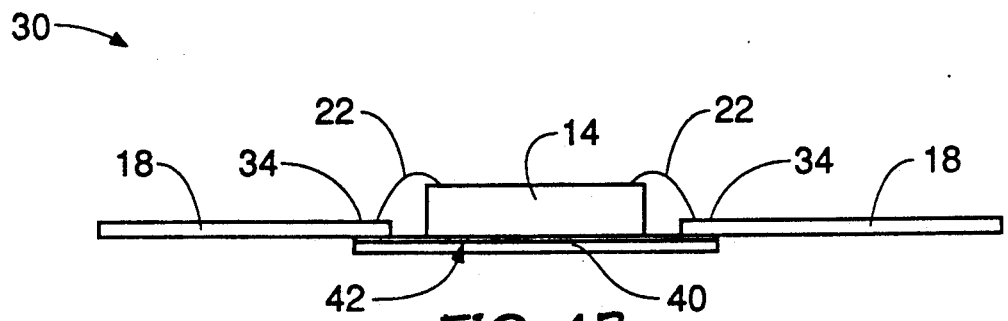
FIG. 4B is a cross section, showing an inventive embodiment wherein an adhesive tape material immobilizes the lead fingers and attaches the die and lead frame.

After the lead fingers 34 are trimmed, they are immobilized with a tape material 40 having an adhesive 42 on one side, as shown in FIGS. 4A (top view) and 4B (cross section). A thermoplastic or thermoset adhesive 42 can be used, as well as other workable materials. The adhesive carrier 40 can comprise plastic, polyimide, or other suitable materials. Once the leads fingers 34 are immobilized, the die 14 is placed onto the tape 40, and the assembly goes through a wire bond step to couple the lead fingers 34 and the bond pads 24 on the die 14. It may also be possible to adhere the die 14 to the tape 40, then attach the die-tape assembly to the lead frame 30.

A major advantage of the invention is that an excise punch which forms the lead frame does not need to be retooled each time a die size is changed. During a conventional die shrink, to keep the bond wires short, a lead frame having a new design with longer lead fingers must be produced to allow for short bond wires. Longer bond wires are known to have problems of detaching during device encapsulation, and detaching before encapsulation due to lead finger movement. Retooling the lead frame currently costs more than $50,000, while retooling an excise punch costs less than $5,000. In addition, a punch which shapes the tape, which could be similar to that shown in FIG. 3, does not need to be retooled each time the die changes. The same size tape is workable for each die size. Another advantage of the invention is that the tape which serves to hold the die in place also prevents lead movement, which can cause problems as described above.

Figure 5A:
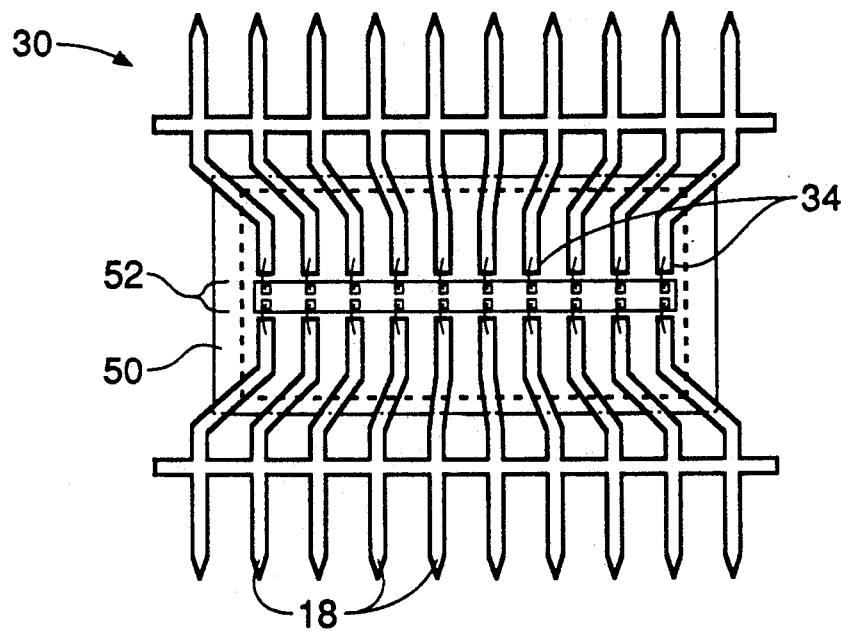
FIG. 5A is a top view, and 5B is a cross section, of an inventive embodiment wherein a void within the perimeter of the tape allows centrally located bond pads (as shown) or laterally located bond pads to be attached to the lead fingers with bond wires in a "leads over" configuration.
Figure 5B:
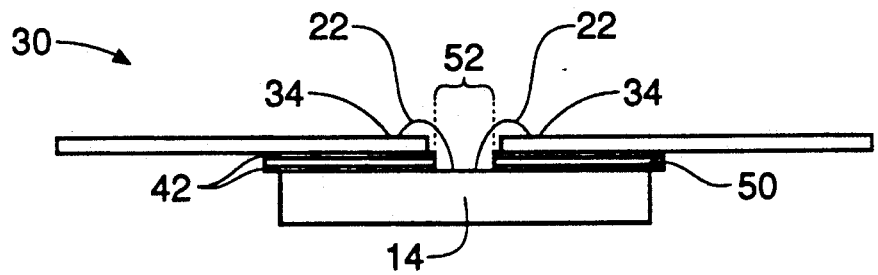

A second embodiment of the invention is shown in FIGS. 5A (top view) and 5B (cross section). In this embodiment, a double-sided tape 50 has an amount of material 52 removed from the central area. The tape 50 is attached to the lead frame 34, and the die 14 is attached to the underneath side of the tape 50 to form a "leads over" configuration.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

We claim:

1. A method of forming a semiconductor assembly, comprising the steps of:
   a) selecting a semiconductor die of a specific size for assembly;
   b) excising a portion of lead fingers from a lead frame to establish an inset of the lead fingers and to produce a paddleless lead frame, whereby the established inset of the lead fingers conforms to external dimensions of the selected die such that the selected die may be located within the inset, the amount of lead finger material excised depending on the size of a semiconductor die to be attached thereto.

2. The method of forming a semiconductor assembly according to claim 1, further comprising the steps of:
   a) attaching a carrier material to said lead fingers, thereby sufficiently immobilizing said lead fingers; and
   b) attaching said semiconductor die to said carrier material.

3. The method of forming a semiconductor assembly according to claim 2, further comprising the step of electrically coupling bond pads on said die and said lead fingers.

4. The method of forming a semiconductor assembly according to claim 3, further comprising the step of encapsulating said lead fingers and said die with an encapsulation material.

5. The method of forming a semiconductor assembly according to claim 3 wherein said bond pads and said lead fingers are coupled with a bond wire.

6. The method of forming a semiconductor assembly according to claim 5 wherein said carrier material has a void therein, and said bond wires pass therethrough.

7. A method of forming a semiconductor assembly, comprising the steps of:
   a) selecting a semiconductor die of a specific size for assembly;
   b) excising a portion of lead fingers from a lead frame with a punch to establish an inset of the lead fingers and to produce a paddleless lead frame, whereby the established inset of the lead fingers conforms to external dimensions of the selected die such that the selected die may be located within the inset, the amount of lead finger material excised depending on the size of a semiconductor die to be attached thereto;
   c) attaching a carrier material to said lead fingers, thereby sufficiently immobilizing said lead fingers; and
   d) attaching said semiconductor die to said carrier material.

8. The method of forming a semiconductor assembly according to claim 7, further comprising the step of electrically coupling bond pads on said die and said lead fingers.

9. The method of forming a semiconductor assembly according to claim 8, further comprising the step of encapsulating said lead fingers and said die with an encapsulation material.

10. The method of forming a semiconductor assembly according to claim 8, wherein said bond pads and said lead fingers are coupled with a bond wire.

11. The method of forming a semiconductor assembly according to claim 10 wherein carrier material void therein and said bond wires pass therethrough.

* * * * *